(12) United States Patent
Tang

(10) Patent No.: US 11,271,062 B2
(45) Date of Patent: Mar. 8, 2022

(54) DOUBLE-SIDED DISPLAY PANEL AND PREPARATION METHOD THEREOF

(71) Applicant: Shenzhen China Star Optoelectronics Semiconductor Display Technology Co., Ltd., Guangdong (CN)

(72) Inventor: Jia Tang, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 358 days.

(21) Appl. No.: 16/617,322

(22) PCT Filed: May 17, 2019

(86) PCT No.: PCT/CN2019/087350
§ 371 (c)(1),
(2) Date: Nov. 26, 2019

(87) PCT Pub. No.: WO2020/206810
PCT Pub. Date: Oct. 15, 2020

(65) Prior Publication Data
US 2021/0367022 A1    Nov. 25, 2021

(30) Foreign Application Priority Data

Apr. 12, 2019   (CN) .......................... 201910293589.1

(51) Int. Cl.
*H01L 27/32*    (2006.01)
*H01L 51/52*    (2006.01)

(52) U.S. Cl.
CPC ........ *H01L 27/3267* (2013.01); *H01L 27/322* (2013.01); *H01L 27/3262* (2013.01);
(Continued)

(58) Field of Classification Search
CPC ............. H01L 27/3265; H01L 27/3267; H01L 27/3272; H01L 2251/5323
See application file for complete search history.

(56) References Cited

U.S. PATENT DOCUMENTS

2007/0152217 A1*   7/2007   Lai ...................... H01L 29/7869
                                                              257/59
2008/0090620 A1    4/2008   Koyama et al.
(Continued)

FOREIGN PATENT DOCUMENTS

CN         1739130 A        2/2006
CN         103227186 A      7/2013
(Continued)

*Primary Examiner* — Daniel P Shook
(74) *Attorney, Agent, or Firm* — Taft Stettinius & Hollister LLP

(57) ABSTRACT

A double-sided display panel includes a base substrate, a thin film transistor array, a first OLED light emitting layer located in a top light emitting area and a second OLED light emitting layer located in a bottom light emitting area; the thin film transistor array is located in the top light emitting area; a thin film transistor of the thin film transistor array simultaneously controls a top light emitting subpixel and a bottom light emitting subpixel. Through one OLED back plate to realize double-sided simultaneous display, can reduce whole thickness of the OLED double-sided display panel, simplify manufacturing process, thereby saving manufacturing costs.

19 Claims, 7 Drawing Sheets

(52) U.S. Cl.
   CPC ...... *H01L 27/3265* (2013.01); *H01L 27/3272* (2013.01); *H01L 51/5253* (2013.01); *H01L 2251/5323* (2013.01)

(56) References Cited

U.S. PATENT DOCUMENTS

| | | |
|---|---|---|
| 2009/0051285 A1 | 2/2009 | Kajiyama et al. |
| 2013/0193843 A1* | 8/2013 | Yan ................. H01L 27/3267 313/504 |
| 2016/0141349 A1 | 5/2016 | Yun et al. |
| 2016/0233282 A1 | 8/2016 | Song et al. |
| 2016/0307985 A1 | 10/2016 | Beak et al. |
| 2019/0267442 A1* | 8/2019 | Wang ................. H01L 51/5206 |
| 2020/0235185 A1 | 7/2020 | Nie |

FOREIGN PATENT DOCUMENTS

| | | |
|---|---|---|
| CN | 104752637 A | 7/2015 |
| CN | 105609528 A | 5/2016 |
| CN | 105810714 A | 7/2016 |
| CN | 107564940 A | 1/2018 |
| CN | 107591425 A | 1/2018 |
| CN | 108364990 A | 8/2018 |
| CN | 108598121 A | 9/2018 |
| CN | 109192752 A | 1/2019 |
| CN | 109300960 A | 2/2019 |
| JP | 2014191329 A | 10/2014 |

\* cited by examiner

DOUBLE-SIDED DISPLAY PANEL AND PREPARATION METHOD THEREOF

CROSS-REFERENCE TO RELATED APPLICATIONS

This application is a U.S. National Phase of International PCT Application No. PCT/CN2019/087350 filed May 17, 2019, which claims the benefit of Chinese Patent Application Serial No. 201910293589.1 filed Apr. 12, 2019, the contents of each application are incorporated herein by reference in their entirety.

FIELD OF INVENTION

The present disclosure relates to display technology field, and particular to a double-sided display panel and a preparation method thereof.

BACKGROUND OF INVENTION

Main two types of active-matrix organic light-emitting diode (AMOLED) display panels are bottom light emitting and top light emitting, where a display panel has glass as a substrate and also has a flexible substrate product (not yet mature). However, there are few research reports about AMOLED double-sided display back plate which mainly is after bonding two array back plates back-to-back, and then each of the array back plates displays by itself.

Organic light emitting diode (OLED) displays have many advantages, such as being self-illuminous, have a low driving voltage, high luminous efficacy, short response time, high contrast, wide visual angles, wide temperature application range, can realize a flexible display and full color display with large area, etc., which is recognized as the most promising display by the industry.

With development of display technology, consumers not only require a display provided with characteristics such as quick response speed, high resolution and exquisite picture quality, but also pursue breakthrough capabilities and display modes. Therefore, an OLED double-sided display came into being, an OLED double-sided display not only has characteristics of a common OLED display, but also can extend screen space, quickly swap and process many display pictures, thereby having great application space in advertising and portable electronics.

Presently, a general design of double-sided display is after bonding two back plates back-to-back, then realize double-sided display. However, this kind of the design requires two independent OLED display panels, causing a thickness of the display be thick, complex structure and process and high manufacturing cost, and does not meet consumers' expectation of light, thin and high cost-performance ratio requirements.

SUMMARY OF INVENTION

The present disclosure provides a double-sided display panel and a preparation method thereof to solve the technical problem of a current double-sided display such as bonding two independent organic light emitting diode (OLED) back plates back-to-back to realize double-sided display, causing the double-sided display panel has a thick thickness and complex process.

In order to solve the problems mentioned above, the present disclosure provides the technical solutions as follows:

The present disclosure provides a double-sided display panel, a top light emitting area and a bottom light emitting area that are distributed sequentially and alternately defined on the double-sided display panel. The double-sided display panel includes a base substrate, a thin film transistor array, a first organic light emitting diode (OLED) light emitting layer, a second OLED light emitting layer, a color filter layer and a storage capacitor; the thin film transistor array is disposed on the base substrate; the first OLED light emitting layer is disposed on the thin film transistor array and is located in the top light emitting area; the second OLED light emitting layer is disposed on the thin film transistor array and is located in the bottom light emitting area; the color filter layer is disposed on the base substrate and is located in the bottom light emitting area; the storage capacitor is disposed between the second OLED light emitting layer and the base substrate and is located in the bottom light emitting area, and the storage capacitor includes a first transparent electrode layer and a second transparent electrode layer which are disposed oppositely. The thin film transistor array is located in the top light emitting area, a thin film transistor of the thin film transistor array simultaneously controls a top light emitting subpixel and a bottom light emitting subpixel.

In an embodiment of the present disclosure, the first transparent electrode layer is disposed between the thin film transistor array and the base substrate, and the second transparent electrode layer is disposed between the first transparent electrode layer and the second OLED light emitting layer.

In an embodiment of the present disclosure, the thin film transistor array includes an active layer, a gate electrode, a source drain electrode layer, and the source drain electrode layer is a two-layer composite membrane structure.

In an embodiment of the present disclosure, a protective layer is disposed on the color filter layer, and the protective layer covers the color filter layer.

In an embodiment of the present disclosure, the first OLED light emitting layer includes a top light emitting anode, a first OLED organic capability layer, and a top light emitting cathode which are disposed sequentially.

In an embodiment of the present disclosure, the second OLED light emitting layer includes a bottom light emitting anode, a second OLED organic capability layer, and a bottom light emitting cathode which are disposed sequentially.

The present disclosure further provides a double-sided display panel, a top light emitting area and a bottom light emitting area that are distributed sequentially and alternately defined on the double-sided display panel. The double-sided display panel includes a base substrate, a thin film transistor array, a first OLED light emitting layer, a second OLED light emitting layer and a storage capacitor; the thin film transistor array is disposed on the base substrate; the first OLED light emitting layer is disposed on the thin film transistor array and is located in the top light emitting area; the second OLED light emitting layer is disposed on the thin film transistor array and is located in the bottom light emitting area; the storage capacitor is disposed between the second OLED light emitting layer and the base substrate and is located in the bottom light emitting area. The thin film transistor array is located in the top light emitting area, a thin film transistor of the thin film transistor array simultaneously controls a top light emitting subpixel and a bottom light emitting subpixel.

In an embodiment of the present disclosure, the storage capacitor includes a first transparent electrode layer and a second transparent electrode layer which are disposed oppositely.

In an embodiment of the present disclosure, the first transparent electrode layer is disposed between the thin film transistor array and the base substrate, and the second transparent electrode layer is disposed between the first transparent electrode layer and the second OLED light emitting layer.

In an embodiment of the present disclosure, the double-sided display panel further includes a color filter layer disposed on the base substrate and located in the bottom light emitting area.

In an embodiment of the present disclosure, a protective layer is disposed on the color filter layer, and the protective layer covers the color filter layer.

In an embodiment of the present disclosure, the thin film transistor array includes an active layer, a gate electrode, a source drain electrode layer, and the source drain electrode layer is a two-layer composite membrane structure.

In an embodiment of the present disclosure, the first OLED light emitting layer includes a top light emitting anode, a first OLED organic capability layer, and a top light emitting cathode which are disposed sequentially.

In an embodiment of the present disclosure, the second OLED light emitting layer includes a bottom light emitting anode, a second OLED organic capability layer, and a bottom light emitting cathode which are disposed sequentially.

The present disclosure further provides a preparation method for a double-sided display panel, including:

step S10: providing a base substrate, and defining a top light emitting area and a bottom light emitting area which are distributed sequentially and alternately;

step S20: forming a first transparent electrode layer and a light shielding layer on the base substrate, and the light shielding layer is located in the top light emitting area;

step S30: forming a thin film transistor array on the light shielding layer, and the thin film transistor array is located in the top light emitting area, and the thin film transistor array includes an active layer, a gate electrode and a source drain electrode layer;

step S40: forming a first OLED light emitting layer located in the top light emitting area and forming a second OLED light emitting layer located in the bottom light emitting area on the thin film transistor array.

In an embodiment of the present disclosure, before the step S20, the preparation method includes:

forming a color filter layer on the base substrate, and the color filter layer is located in the bottom light emitting area;

forming a protective layer on the color filter layer.

In an embodiment of the present disclosure, the step S20 includes:

step S201: coating a first indium tin oxide (ITO) membrane layer and a first metal membrane layer on the protective layer sequentially;

step S202: after using a first halftone mask plate to perform a same mask process on the first ITO membrane layer and the first metal membrane layer, forming a first transparent electrode layer of the storage capacitor on the bottom light emitting area, and forming a light shielding layer on the top light emitting area.

In an embodiment of the present disclosure, the step S30 includes:

step S301: forming a buffer layer, the active layer, a gate insulating layer, the gate electrode and an interlayer insulation layer on the light shielding layer sequentially;

step S302: coating a second ITO membrane layer and a second metal membrane layer on the interlayer insulation layer sequentially;

step S303: after using a second halftone mask plate to perform a same mask process on the second ITO membrane layer and the second metal membrane layer, forming a second transparent electrode layer of the storage capacitor on the bottom light emitting area, and forming the source drain electrode layer which is a two-layer composite membrane structure on the light emitting area.

In an embodiment of the present disclosure, the step S40 includes:

step S401: forming a passivation layer on the source drain electrode layer;

step S402: coating a bottom ITO membrane layer, a middle metal membrane layer and a top ITO membrane layer on the passivation layer sequentially;

step S403: using a third halftone mask plate to perform a same mask process on the bottom ITO membrane layer, the middle metal membrane layer and the top ITO membrane layer, forming a bottom light emitting anode on the storage capacitor, and forming a top light emitting anode which is a tri-layer composite membrane structure on the thin film transistor array;

step S404: forming a pixel definition layer on the bottom light emitting anode and the top light emitting anode;

step S405: forming a second OLED organic capability layer and a bottom light emitting cathode on the bottom light emitting anode;

step S406: forming a first OLED organic capability layer and a top light emitting cathode on the top light emitting anode.

The beneficial effects of the present disclosure: through one OLED back plate to realize double-sided simultaneous display, can reduce whole thickness of the OLED double-sided display panel, simplify manufacturing process, thereby saving manufacturing cost.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
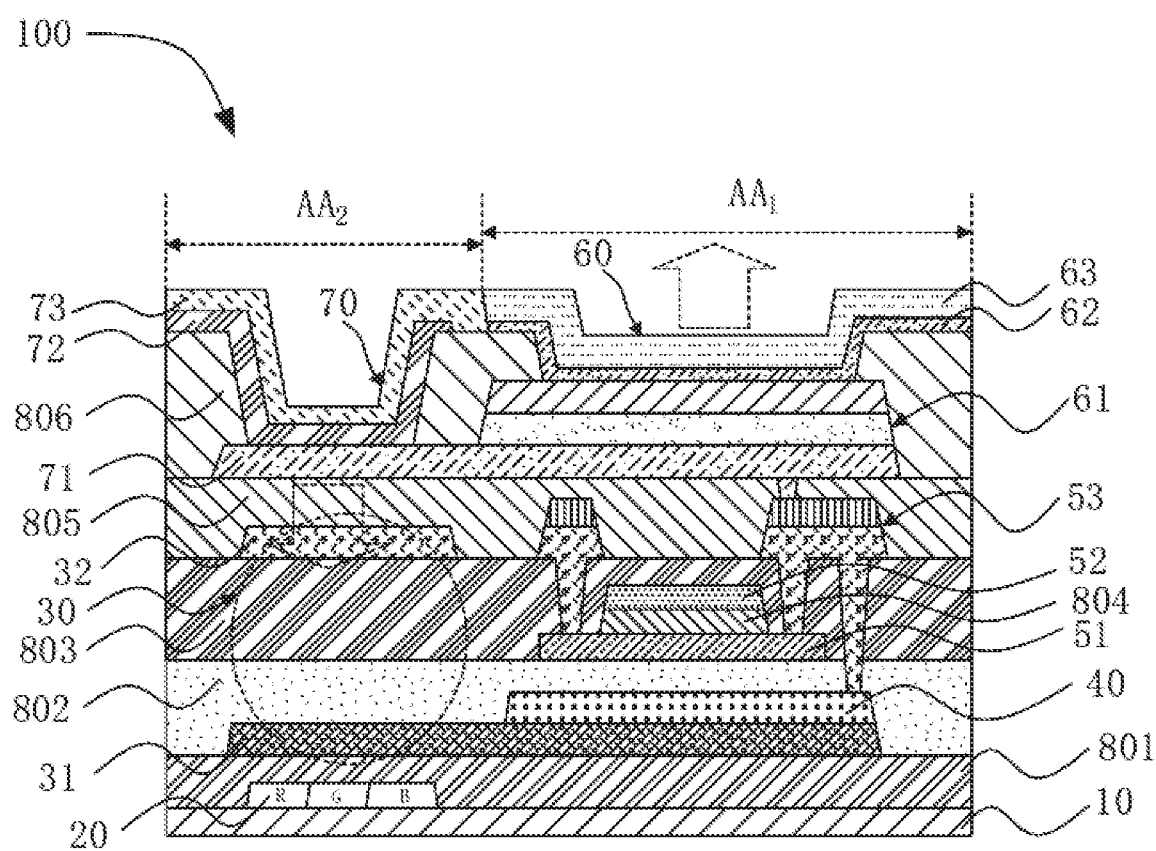
FIG. 1 is a structural schematic diagram of a double-sided OLED display panel of the first embodiment of the present disclosure.

The descriptions of embodiments below refer to accompanying drawings in order to illustrate certain embodiments which the present disclosure can implement. The directional terms of which the present disclosure mentions, for example, "top," "bottom," "upper," "lower," "front," "rear," "left,"

"right," "inside," "outside," "side," etc., are just refer to directions of the accompanying figures. Therefore, the used directional terms are for illustrating and understanding the present disclosure, but not for limiting the present disclosure. In the figures, units with similar structures are used same labels to indicate.

The present disclosure aims at a current double-sided display panel having technical problems, such as due to bonding two independent organic light emitting diode (OLED) back plates back-to-back to realize double-sided display, causing the double-sided display panel to have a thick thickness and complex process. The present disclosure can overcome such defects.

The present disclosure provides a double-sided display panel, a top light emitting area and a bottom light emitting area that are distributed sequentially and alternately defined on the double-sided display panel. The double-sided display panel includes a base substrate, a thin film transistor array disposed on the base substrate, a first OLED light emitting layer and a second OLED light emitting layer which are disposed on the thin film transistor array.

The first OLED light emitting layer is located in the top light emitting area; the second OLED light emitting layer is located in on the bottom light emitting area; the top light emitting area and the bottom light emitting area are distributed sequentially and alternately on the double-sided display panel, and correspondingly, the first OLED light emitting layer and the second OLED light emitting layer are alternately arranged.

The thin film transistor array is located in the top light emitting area, and because of devices in the thin film transistor array prepared by metal which has an ability to shield light, the second OLED light emitting layer located in the bottom light emitting area requires to pass through the thin film transistor array of a bottom layer to emit light, the first OLED light emitting layer located in the top light emitting area does not require to pass through the thin film transistor array of the bottom layer and directly emits light. Therefore, to dispose the thin film transistor array on the top light emitting area, thereby increasing the aperture ratio of the bottom light emitting area.

The thin film transistor array includes a plurality of thin film transistors distributed in arrays, the thin film transistors includes a source electrode, a drain electrode, agate electrode and an active layer. One of the thin film transistors simultaneously controls a top light emitting subpixel and a bottom light emitting subpixel, that is, one top light emitting sub pixel and one bottom light emitting sub pixel share with one thin film transistor, anode signals of the two subpixels are same, and when the thin film transistor is working, controlling the corresponding top light emitting sub pixel and the bottom light emitting sub pixel to turn on or turn off simultaneously.

The double-sided display panel will be described in detail below in combined with specific embodiments.

As illustrated in FIG. 1, a top light emitting area $AA_1$ and a bottom light emitting area $AA_2$ are defined on the double-sided display panel 100, and the double-sided display 100 panel includes a base substrate 10, a color filter layer 20, a storage capacitor 30, light shielding layer 40, a thin film transistor array, a first OLED light emitting layer 60 and a second OLED light emitting layer 70.

The top light emitting area $AA_1$ and the bottom light emitting area $AA_2$ are distributed sequentially and alternately, and in the figure, only a structural diagram of one top light emitting area $AA_1$ and one bottom light emitting area $AA_2$ is shown as a schematic diagram.

The first OLED light emitting layer 60 and the second OLED light emitting layer 70 are both disposed on the thin film transistor array. The first OLED light emitting layer 60 is disposed on the top light emitting area $AA_1$, and it is a top light emitting type OLED device; the second OLED light emitting layer 70 is disposed on the bottom light emitting area $AA_2$, and it is a bottom light emitting type OLED device.

The first OLED light emitting layer 60 includes a top light emitting anode 61, a first OLED organic capability layer 62, and a top light emitting cathode 63 which are disposed sequentially; the second OLED light emitting layer 70 includes a bottom light emitting anode 71, a second OLED organic capability layer 72, and a bottom light emitting cathode 73 which are disposed sequentially.

The thin film transistor array is disposed on the base substrate 10 and in the top light emitting area $AA_1$, and the thin film transistor array includes an active layer 51, a gate electrode 52 disposed on the active layer 51, a source drain electrode layer 53 disposed on the gate electrode layer.

The storage capacitor 30 is disposed in the bottom light emitting area $AA_2$, the storage capacitor 30 is disposed between the second OLED light emitting layer 70 and the base substrate 10, and it is disposed just below the second OLED light emitting layer 70.

The storage capacitor 30 includes a first transparent electrode layer 31 and a second transparent electrode layer 32 which are disposed oppositely; the first transparent electrode layer 31 is disposed between the thin film transistor array and the base substrate 10, and the second transparent electrode layer 32 is disposed between the first transparent electrode layer 31 and the second OLED light emitting layer 70.

A traditional bottom light emitting back plate, metal material is used as two electrodes of a capacitor, a bottom light emitting area and a capacitor area are generally staggered. This is because a bottom of the second OLED light emitting layer 70 of the bottom light emitting area $AA_2$ requires that there cannot be shielded by non-transparent material. In order to improve an aperture ratio of the present disclosure, the two electrode layers of the storage capacitor 30 of the present disclosure are both adopted transparent material to prepare, thereby making the bottom light emitting area $AA_2$ can be disposed on the capacitor area.

Specifically, in this embodiment, the color filter layer 20 is disposed on the base substrate 10 and is located in the bottom light emitting area $AA_2$; the color filter layer 20 includes a red block, a green block and a blue block. A protective layer 801 is disposed on the color filter layer 20, and the protective layer 801 covers the color filter layer 20.

The first transparent electrode layer 31 is disposed on the protective layer 801; the light shielding layer 40 is disposed on the first transparent electrode layer 31, and the light shielding layer 40 is disposed in the top light emitting area $AA_1$. The light shielding layer 40 is disposed just below the thin film transistor array in order to block light from bottom to prevent the light from bottom shining on the thin film transistor array and causing influence to the thin film transistor device.

A buffer layer 802 is disposed on the light shielding layer 42; the active layer 51 is disposed on the buffer layer 802; an interlayer insulation layer 803 is disposed on the gate electrode 52; a plurality of first vias are disposed on the interlayer insulation layer 803 to expose a surface of two ends of the active layer 51 or part of a surface of the light shielding layer 40, and the source drain electrode layer 53 is electrically connected to the active layer or the light shielding layer 40 through the first vias.

The second transparent electrode layer 32 is disposed on the same layer as the source drain electrode layer 53 of the thin film transistor array; the source drain electrode layer 53 is disposed on the interlayer insulation layer 803, and the source drain electrode layer 53 is a two-layer composite membrane structure; the source drain electrode layer 53 from bottom to top is an indium tin oxide (ITO) membrane layer and a metal membrane layer sequentially, and the ITO membrane layer is disposed on the same layer as the second transparent electrode layer 32.

A passivation layer 805 is disposed on the source drain electrode layer 53; a second via is disposed on the passivation layer 805 to expose the source electrode and the drain electrode of the source drain electrode layer 53. The top light emitting anode 61 and the bottom light emitting anode 71 are electrically connected to the source electrode and the drain electrode through the second via.

The top light emitting anode 61 is disposed on the passivation layer 805; the top light emitting anode 61 is a tri-layer composite membrane structure and includes a bottom ITO membrane layer, a middle metal membrane layer and a top ITO membrane layer which are disposed sequentially; the part of the bottom ITO membrane layer located in the bottom light emitting area $AA_2$ is as a bottom light emitting anode 71 of the second OLED light emitting layer 70.

A pixel definition layer 806 is disposed on the bottom light emitting anode 71 and the top light emitting anode 61; a plurality of pixel definition areas are disposed on the pixel definition layer 806 to accommodate part of devices of the first OLED light emitting layer 60 and the second OLED light emitting layer 70, for example a first OLED organic capability layer 62 and a second OLED organic capability layer 72.

In this embodiment, the first OLED light emitting layer is independent red, green and blue light emitting material, and in another embodiment, it can be white-light light emitting material, but it is necessary to be disposed a color filter on the first OLED light emitting layer 60 and correspondingly bonded and encapsulated to the color filter 60.

The second OLED light emitting layer 70 is white-light light emitting material, and in another embodiment, the second OLED light emitting layer 70 can be independent red, green and blue light emitting material through an evaporation deposition process, and is necessary to remove the color filter layer 20 on the base substrate 10.

Figure 2:
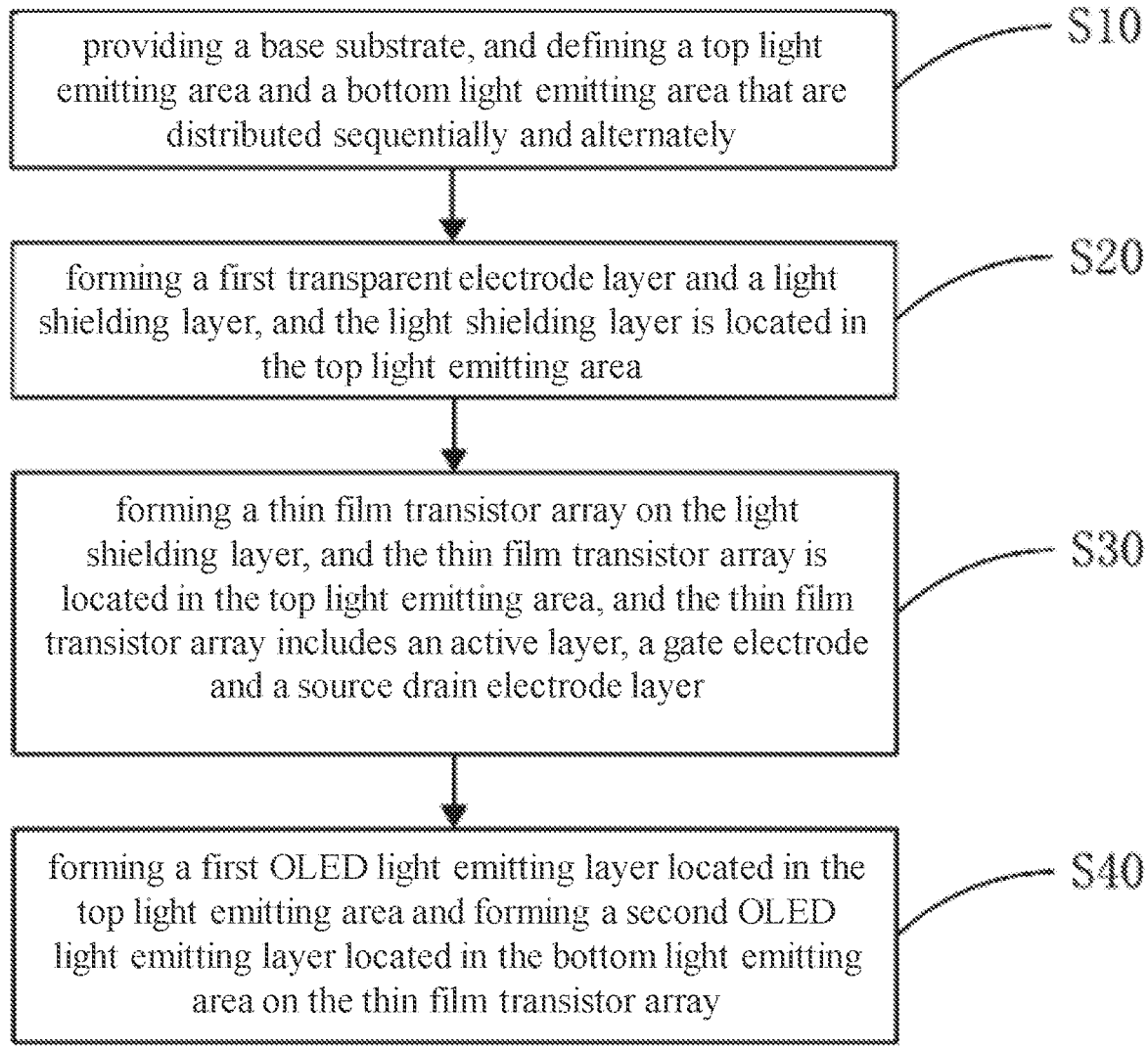
FIG. 2 is a step flow diagram of a preparation method for a double-sided OLED display panel of the first embodiment of the present disclosure.

As illustrated in FIG. 2, the present disclosure further provides a preparation method for the double-sided display panel mentioned above, which includes:

step S10: providing a base substrate, and defining a top light emitting area $AA_1$ and a bottom light emitting area $AA_2$ that are distributed sequentially and alternately.

Figure 5:
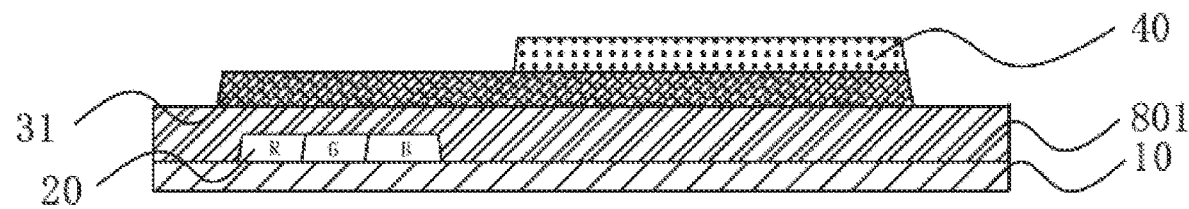
Figure 6:
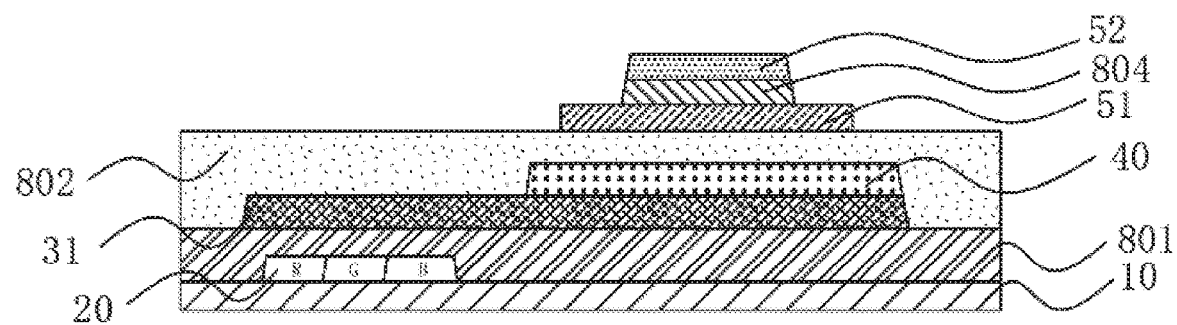
Figure 7:
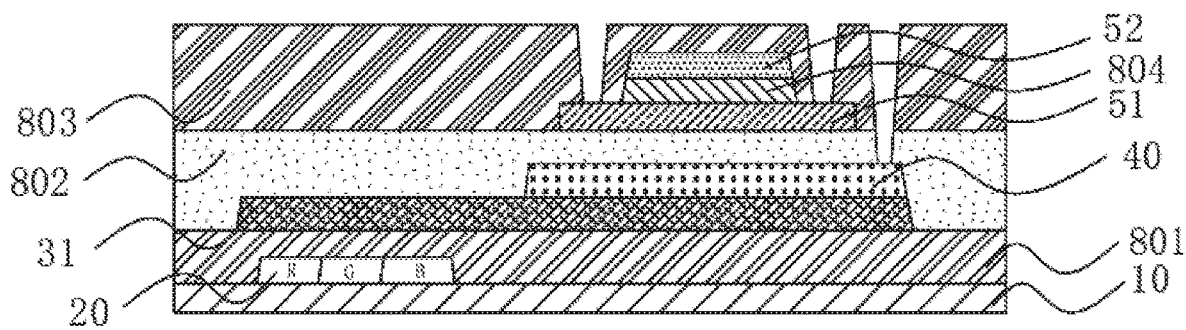
Figure 8:
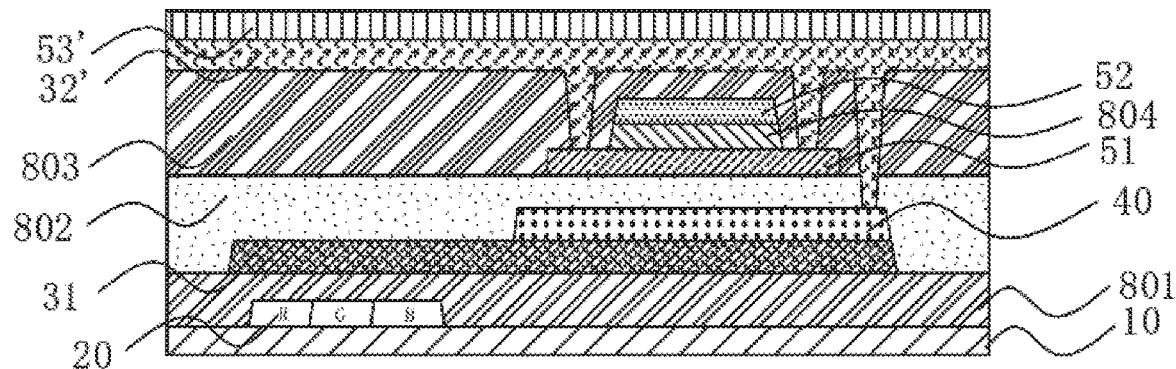
Figure 9:
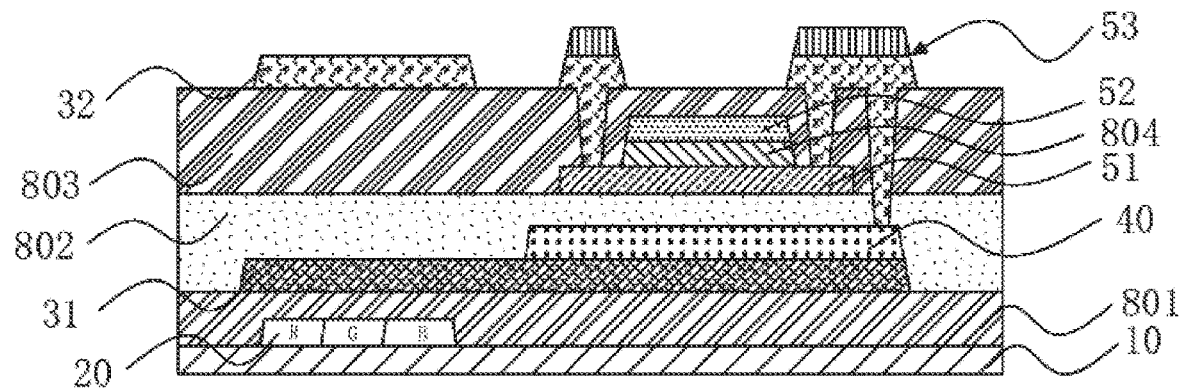
Figure 10:
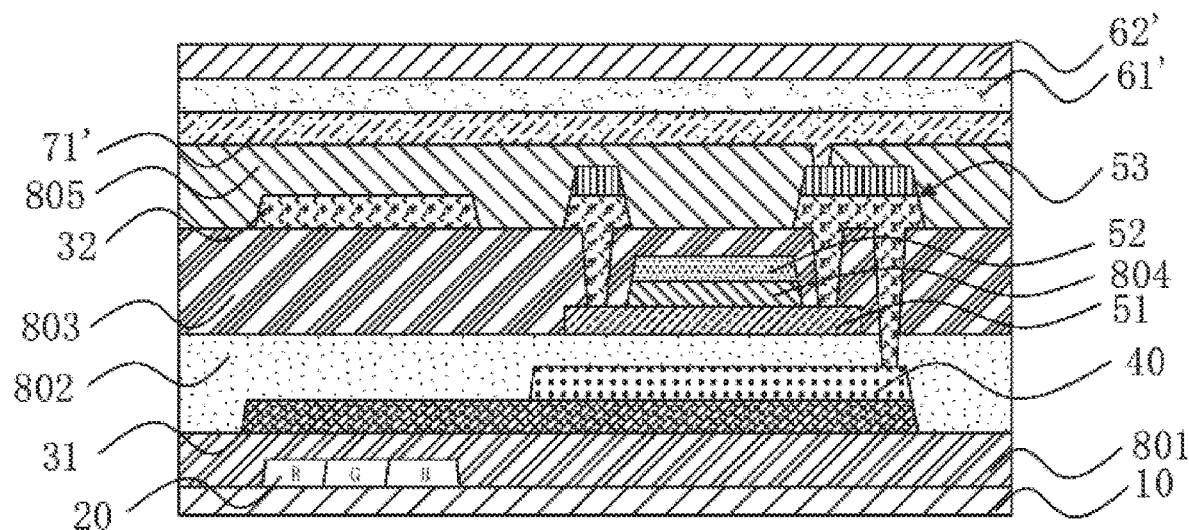
Figure 11:
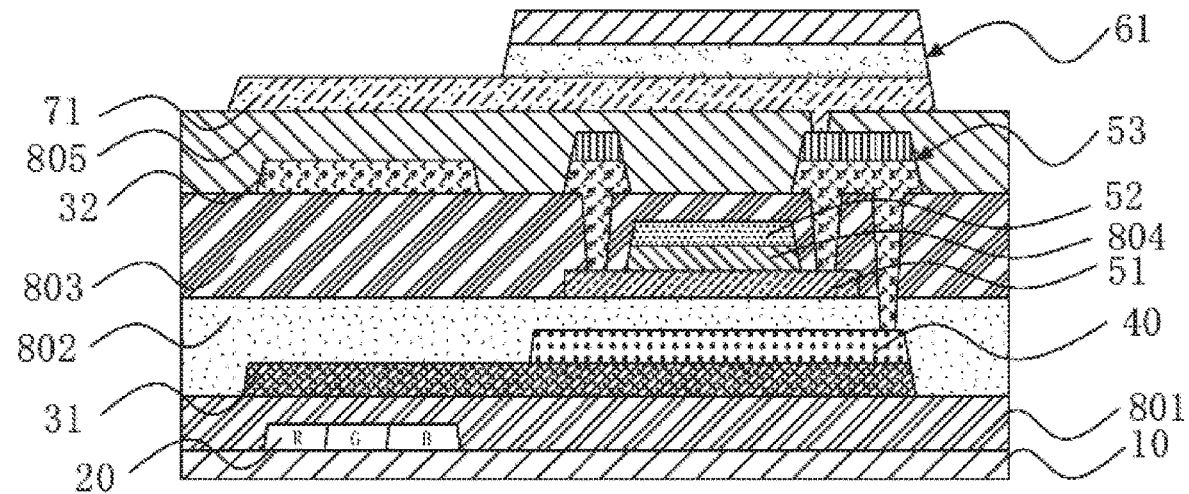
Figure 12:
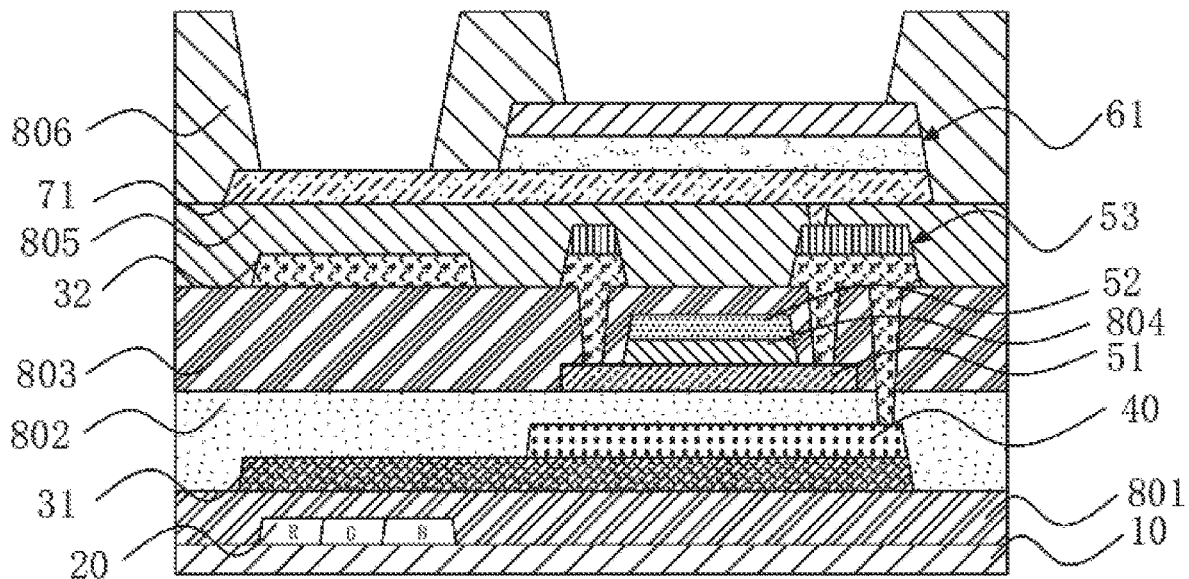
Figure 13:
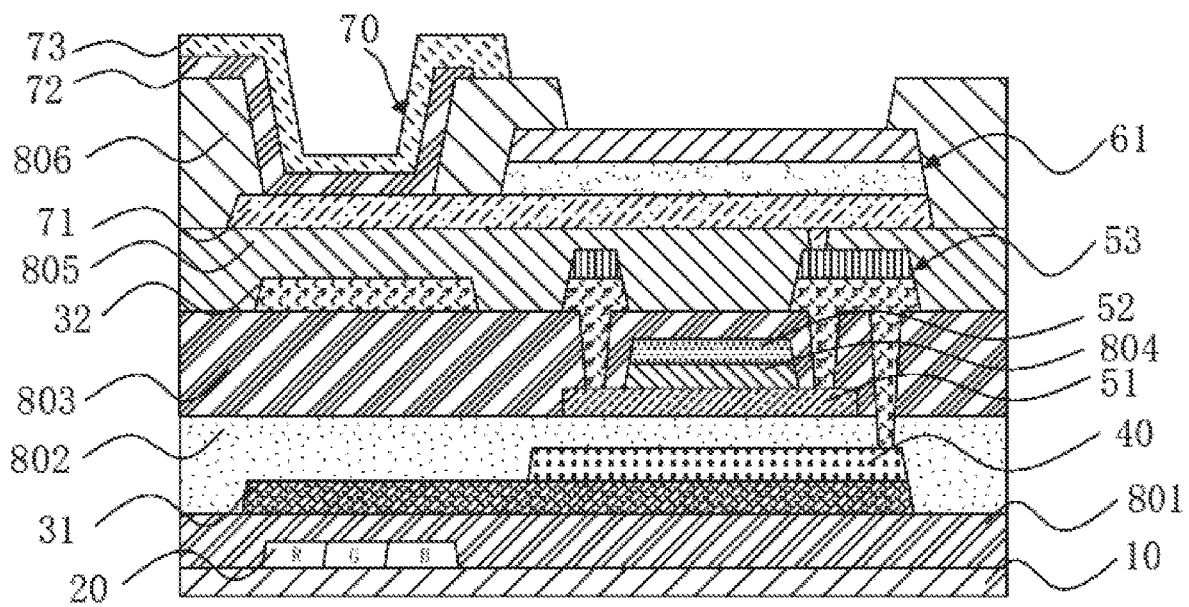

The base substrate 10 is a glass substrate and can be other transparent material.

step S20: forming a first transparent electrode layer 31 and a light shielding layer 40 on the base substrate 10, and the light shielding layer 40 is located in the top light emitting area $AA_1$, as illustrated in FIG. 5.

Figure 3:
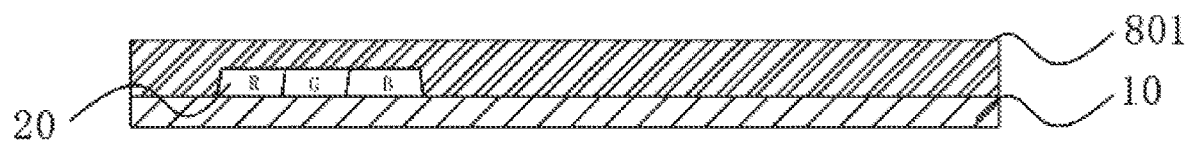
FIG. 3 to FIG. 13 are structural schematic diagrams of a preparation process of a double-sided OLED display panel of the first embodiment of the present disclosure.

As illustrated in FIG. 3, before the step S20, coating a red block, a green block and a blue block on the base substrate 10 first, and performing a patterning process to form a color filter layer 20 in the bottom light emitting area $AA_2$ on the base substrate 10, and then forming a protective layer 801 on the color filter layer 20.

Figure 4:
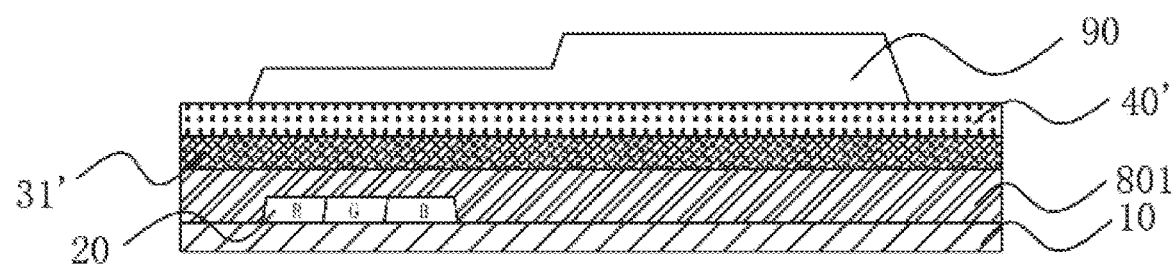

As illustrated in FIG. 4, in the step S20, coating a first ITO membrane layer 31' and a first metal membrane layer 40' on the protective layer 801 sequentially first, and then coating photoresist 90 on the first metal membrane layer 40', and after using a first halftone mask plate to perform a exposure process, a development process and an etch process on the first ITO membrane layer 31' and the first metal membrane layer 40', peeling off the photoresist 90 to form a patterned first transparent electrode layer 31 and a light shielding layer 40.

As illustrated in FIG. 6 to FIG. 9, step S30: forming a thin film transistor array on the light shielding layer, and the thin film transistor array is located in the top light emitting area $AA_1$, and the thin film transistor array includes an active layer 51, a gate electrode 52 and a source drain electrode layer 53.

At first, preparing a buffer layer 802 on the light shielding layer 40, and then preparing an active layer 51 on the buffer layer, after that, sequentially coating gate insulating layer material and metal material on the active layer 51, and then performing a patterning process on the gate insulating layer material and the metal material to form a gate insulating layer 804 and a gate electrode 52 and perform a conductorization process on the part of the active layer 51 where is not covered by the gate insulating layer 804 and the gate electrode 52.

Material of the active layer 51 is indium gallium zinc oxide and can be other oxide material.

After that, forming a patterned interlayer insulation layer 803 on the buffer layer 802, and a plurality of first vias are disposed on the interlayer insulation layer 803 to expose a surface of two ends of the active layer 51 or part of a surface of the light shielding layer 40.

Then coating a second ITO membrane layer 32' and a second metal membrane layer 53' on the interlayer insulation layer 803 sequentially; after using a second halftone mask plate to perform a same mask process on the second ITO membrane layer 32' and the second metal membrane layer 53', forming a second transparent electrode layer 32 in the bottom light emitting area $AA_2$, and forming the source drain electrode layer 53 which is a two-layer composite membrane structure in the light emitting area $AA_1$; the first transparent electrode layer 31 and the second transparent electrode layer 32 form into storage capacitor 30.

As illustrated in FIG. 10 to FIG. 13, step S40: forming a first OLED light emitting layer 60 located in the top light emitting area $AA_1$ and forming a second OLED light emitting layer 70 located in the bottom light emitting area $AA_2$ on the thin film transistor array.

At first, forming a passivation layer 805 on the source drain electrode layer 53; a second via is disposed on the passivation layer 805 to expose the source electrode and the drain electrode of the source drain electrode layer 53.

Then coating a bottom ITO membrane layer 71', a middle metal membrane layer 61' and a top ITO membrane layer 62' on the passivation layer 805 sequentially, and then use a third halftone mask plate to perform a same mask process on the bottom ITO membrane layer 71', the middle metal membrane layer 61' and the top ITO membrane layer 62'; forming a bottom light emitting anode 71 on the storage capacitor, and forming a top light emitting anode 61 which is a tri-layer composite membrane structure on the thin film transistor array.

After that, forming a pixel definition layer 806 on the bottom light emitting anode 71 and the top light emitting anode 61, and then forming a second OLED organic capability layer 72 and a bottom light emitting cathode 73 on the bottom light emitting anode 71; finally, forming a first OLED organic capability layer 62 and a top light emitting cathode 63 on the top light emitting anode 61.

The beneficial effect is through one OLED back plate to realize double-sided simultaneous display, can reduce whole thickness of the OLED double-sided display panel, simplify manufacturing process, thereby save manufacturing cost.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A double-sided display panel, wherein a top light emitting area and a bottom light emitting area that are distributed sequentially and alternately defined on the double-sided display panel, and the double-sided display panel comprises:
   a base substrate;
   a thin film transistor array disposed on the base substrate;
   a first organic light emitting diode (OLED) light emitting layer disposed on the thin film transistor array and located in the top light emitting area;
   a second OLED light emitting layer disposed on the thin film transistor array and located in the bottom light emitting area;
   a color filter layer disposed on the base substrate and located in the bottom light emitting area; and
   a storage capacitor disposed between the second OLED light emitting layer and the base substrate and located in the bottom light emitting area; the storage capacitor comprising a first transparent electrode layer and a second transparent electrode layer which are disposed oppositely;
   wherein the thin film transistor array is located in the top light emitting area, a thin film transistor of the thin film transistor array simultaneously controls a top light emitting subpixel and a bottom light emitting subpixel.

2. The double-sided display panel as claimed in claim 1, wherein the first transparent electrode layer is disposed between the thin film transistor array and the base substrate, and the second transparent electrode layer is disposed between the first transparent electrode layer and the second OLED light emitting layer.

3. The double-sided display panel as claimed in claim 1, wherein the thin film transistor array comprises an active layer, a gate electrode, a source drain electrode layer, and the source drain electrode layer is a two-layer composite membrane structure.

4. The double-sided display panel as claimed in claim 1, wherein a protective layer is disposed on the color filter layer, and the protective layer covers the color filter layer.

5. The double-sided display panel as claimed in claim 1, wherein the first OLED light emitting layer comprises a top light emitting anode, a first OLED organic capability layer, and a top light emitting cathode which are disposed sequentially.

6. The double-sided display panel as claimed in claim 1, wherein the second OLED light emitting layer comprises a bottom light emitting anode, a second OLED organic capability layer, and a bottom light emitting cathode which are disposed sequentially.

7. A double-sided display panel, wherein a top light emitting area and a bottom light emitting area that are distributed sequentially and alternately defined on the double-sided display panel, and the double-sided display panel comprises:
   a base substrate;
   a thin film transistor array disposed on the base substrate;
   a first organic light emitting diode (OLED) light emitting layer disposed on the thin film transistor array and located in the top light emitting area;
   a second OLED light emitting layer disposed on the thin film transistor array and located in the bottom light emitting area; and
   a storage capacitor disposed between the second OLED light emitting layer and the base substrate and located in the bottom light emitting area;
   wherein the thin film transistor array is located in the top light emitting area, a thin film transistor of the thin film transistor array simultaneously controls a top light emitting subpixel and a bottom light emitting subpixel.

8. The double-sided display panel as claimed in claim 7, wherein the storage capacitor comprises a first transparent electrode layer and a second transparent electrode layer which are disposed oppositely.

9. The double-sided display panel as claimed in claim 8, wherein the first transparent electrode layer is disposed between the thin film transistor array and the base substrate, and the second transparent electrode layer is disposed between the first transparent electrode layer and the second OLED light emitting layer.

10. The double-sided display panel as claimed in claim 7, wherein the double-sided display panel further comprises a color filter layer disposed on the base substrate and located in the bottom light emitting area.

11. The double-sided display panel as claimed in claim 10, wherein a protective layer is disposed on the color filter layer, and the protective layer covers the color filter layer.

12. The double-sided display panel as claimed in claim 7, wherein the thin film transistor array comprises an active layer, a gate electrode, a source drain electrode layer, and the source drain electrode layer is a two-layer composite membrane structure.

13. The double-sided display panel as claimed in claim 7, wherein the first OLED light emitting layer comprises a top light emitting anode, a first OLED organic capability layer, and a top light emitting cathode which are disposed sequentially.

14. The double-sided display panel as claimed in claim 7, wherein the second OLED light emitting layer comprises a bottom light emitting anode, a second OLED organic capability layer, and a bottom light emitting cathode which are disposed sequentially.

15. A preparation method for a double-sided display panel, comprising:
   step S10: providing a base substrate, and defining a top light emitting area and a bottom light emitting area that are distributed sequentially and alternately;
   step S20: forming a first transparent electrode layer and a light shielding layer, and the light shielding layer is located in the top light emitting area;
   step S30: forming a thin film transistor array on the light shielding layer, and the thin film transistor array is located in the top light emitting area, and the thin film transistor array comprising an active layer, a gate electrode and a source drain electrode layer;
   step S40: forming a first organic light emitting diode (OLED) light emitting layer located in the top light emitting area and forming a second OLED light emitting layer located in the bottom light emitting area on the thin film transistor array.

16. The preparation method as claimed in claim 15, wherein before the step S20, the preparation method comprises:
forming a color filter layer on the base substrate, and the color filter layer is located in the bottom light emitting area;
forming a protective layer on the color filter layer.

17. The preparation method as claimed in claim 16, wherein the step S20 comprises:
step S201: coating a first indium tin oxide (ITO) membrane layer and a first metal membrane layer on the protective layer sequentially;
step S202: after using a first halftone mask plate to perform a same mask process on the first ITO membrane layer and the first metal membrane layer, forming a first transparent electrode layer of the storage capacitor on the bottom light emitting area, and forming a light shielding layer on the top light emitting area.

18. The preparation method as claimed in claim 17, wherein the step S30 comprises:
step S301: forming a buffer layer, the active layer, a gate insulating layer, the gate electrode and an interlayer insulation layer on the light shielding layer sequentially;
step S302: coating a second ITO membrane layer and a second metal membrane layer on the interlayer insulation layer sequentially;
step S303: after using a second halftone mask plate to perform a same mask process on the second ITO membrane layer and the second metal membrane layer, forming a second transparent electrode layer of the storage capacitor on the bottom light emitting area, and forming the source drain electrode layer which is a two-layer composite membrane structure on the light emitting area.

19. The preparation method as claimed in claim 18, wherein the step S40 comprises:
step S401: forming a passivation layer on the source drain electrode layer;
step S402: coating a bottom ITO membrane layer, a middle metal membrane layer and a top ITO membrane layer on the passivation layer sequentially;
step S403: using a third halftone mask plate to perform a same mask process on the bottom ITO membrane layer, the middle metal membrane layer and the top ITO membrane layer, forming a bottom light emitting anode on the storage capacitor, and forming a top light emitting anode which is a tri-layer composite membrane structure on the thin film transistor array;
step S404: forming a pixel definition layer on the bottom light emitting anode and the top light emitting anode;
step S405: forming a second OLED organic capability layer and a bottom light emitting cathode on the bottom light emitting anode;
step S406: forming a first OLED organic capability layer and a top light emitting cathode on the top light emitting anode.

* * * * *